United States Patent [19]

Kappler

[11] Patent Number: 4,946,913
[45] Date of Patent: Aug. 7, 1990

[54] PIEZOELECTRIC COPOLYMERS OF VINYLIDENE FLUORIDE AND TRIFLUOROETHYLENE

[75] Inventor: Patrick Kappler, Ecully, France
[73] Assignee: Atochem, Paris, France
[21] Appl. No.: 278,836
[22] Filed: Dec. 1, 1988
[30] Foreign Application Priority Data

Dec. 8, 1987 [FR] France .............................. 87 17084

[51] Int. Cl.$^5$ .......................................... C08F 214/22
[52] U.S. Cl. ....................................... 526/87; 526/79; 526/255
[58] Field of Search ..................... 526/79, 87

[56] References Cited

U.S. PATENT DOCUMENTS

| | | | |
|---|---|---|---|
| 2,640,050 | 5/1953 | LeFevre et al. ........................ | 526/87 |
| 3,574,178 | 4/1971 | Toyoda et al. ......................... | 526/87 |
| 4,027,086 | 5/1977 | LoValvo et al. ....................... | 526/79 |

Primary Examiner—Bernard Lipman
Attorney, Agent, or Firm—Burgess, Ryan and Wayne

[57] ABSTRACT

A copolymer of vinylidene fluoride and trifluoroethylene having piezoelectric properties useful at elevated temperatures. The total molar content of trifluoroethylene is less than 30% characterized in that it has a heterogeneous structure with a distribution of accumulated molar composition comprised between two straight lines:

$Y = -3.18 X + 140$ and
$Y = -3.12 X + 109$

X is the molar percentage of trifluoroethylene in the macromolecular chains and Y is the percentage by weight of the total of macromolecular chains in which the content of trifluoroethylene is above or equal to X. This copolymer is obtained by copolymerization in an aqueous suspension by a two step process wherein, in a first step, a mixture of vinylidene fluoride and trifluoroethylene in molar proportions of vinylidene fluoride between about 67 and 54% per 33 to 46% trifluoroethylene and in a second step by progressive addition to the polymerization mixture of vinylidene fluoride in proportions such that the molar quantity of vinylidene fluoride added represents from 145 to 180% of the initial moles of vinylidene fluoride.

6 Claims, 1 Drawing Sheet

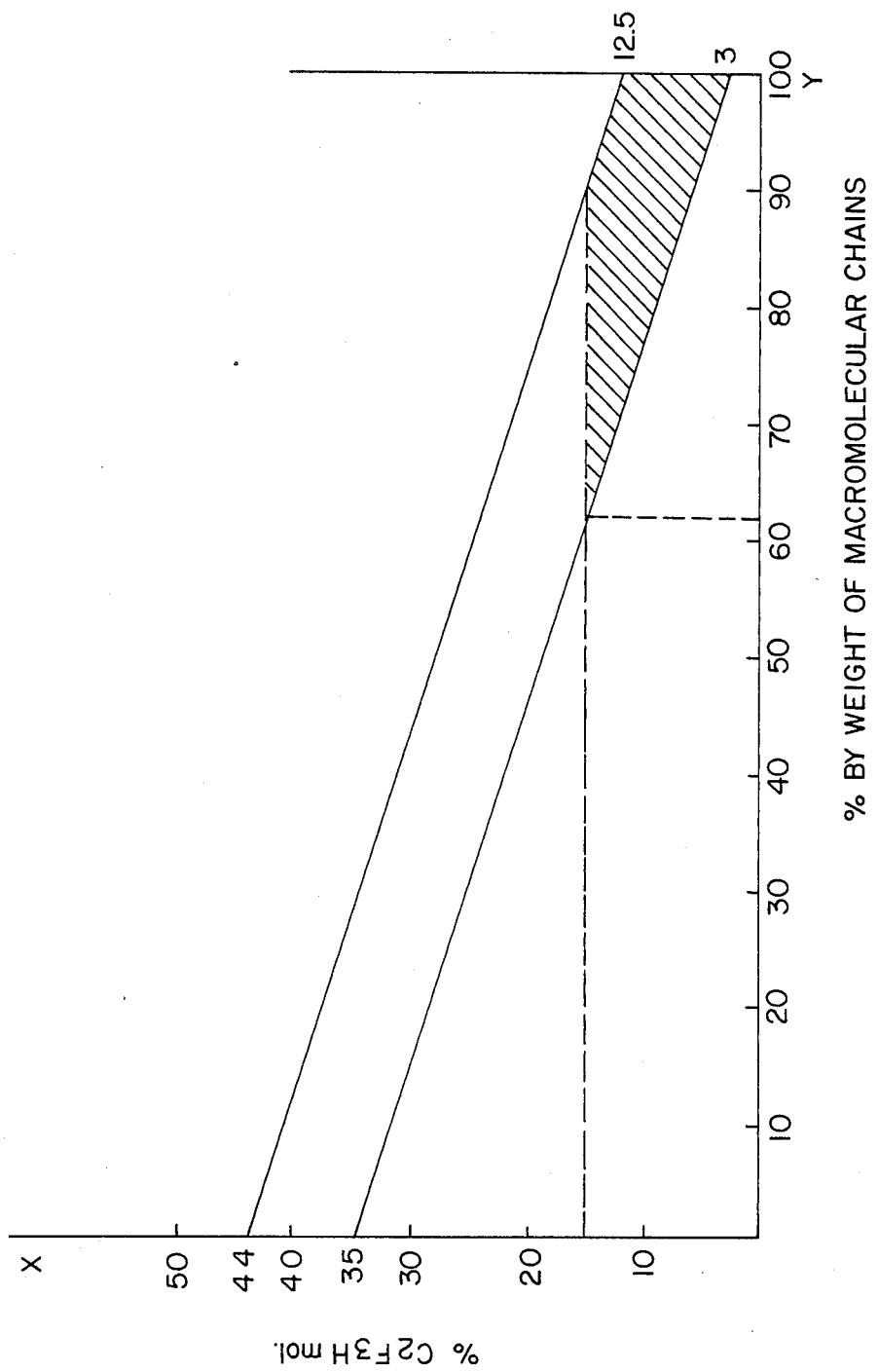

PIEZOELECTRIC COPOLYMERS OF VINYLIDENE FLUORIDE AND TRIFLUOROETHYLENE

FIELD OF THE INVENTION

This invention concerns a heterogeneous copolymer of vinylidene fluoride ($VF_2$) and trifluoroethylene ($C_2F_3H$) having piezoelectric properties which is useful at elevated temperatures.

1. Background of the Invention

The piezoelectric properties of films or plates are defined by the coefficients of proportionality between the mechanical effects and the electrical effects. The coefficients are obtained by measuring the density of charges which appear on the faces of the film or the plate when a mechanical force of 1 Newton per square meter is exerted. When the force is exerted in the direction of thickness of the film, the measured density of charges corresponds to the coefficient $d_{33}$. This coefficient depends on the mode of cyclic polarization such as described in French patent No. 2,538,157. It is proportional to the remaining polarization:

$$d_{33} = -Pr \cdot \frac{dv}{V} \cdot \frac{1}{dx_3}$$

and is substantially equal to $\gamma Pr$

Pr being the remaining polarization dv being the compressibility $dx_3$ being the force applied according to the thickness $\gamma$ being the Young's modulus.

In addition, the maximum temperature of use corresponds to the temperature at which the coefficient $d_{33}$ begins to substantially decline.

The $VF_2$-$C_2F_3H$ copolymers are generally known for their piezoelectric properties having an elevated piezoelectric coefficient $d_{33}$. However, the copolymers which are always of homogeneous structure, possess a maximum temperature of use that is relatively low.

2. Related Art

French patent No. 2,117,315 describes piezoelectric copolymers of $VF_2$ and of a monomer copolymerizable by ethylenic unsaturation. According to the patent, the copolymer is prepared in suspension in the presence of all the comonomers at the beginning of the polymerization. Under these conditions, only a homogeneous copolymer constituted of chains of substantially identical compositions is produced. With such products, it has been observed that if the comonomer is $C_2F_3H$, when its content increases in the copolymer, the $d_{33}$ piezoelectric coefficient increases but the maximum temperature of use is lowered; this is connected with the Curie temperature which is lowered.

There has been described in French patent No. 2,333,817 homogeneous copolymers obtained by copolymerization of $VF_2$ and $C_2F_3H$ that have the properties described above. These properties are confirmed in: Polymer Journal Vol. 12 No. 4, pp. 209-223 (1980) and Vol. 11 No. 6 pp. 429-436 (1979) where it was shown that for a homogeneous copolymer $VF_2$-$C_2F_3H$ the Curie point is lowered as the proportion of $C_2F_3H$ in the copolymer increases.

BRIEF DESCRIPTION OF THE INVENTION

The invention is directed to $VF_2$-$C_2F_3H$ copolymers having piezoelectric properties and an elevated maximum temperature of use. This improvement is due to the heterogeneous nature of the copolymers of the invention. The heterogeneous copolymers of the invention possess, in relation to the general average of the content of monomeric links of the chains, chains of compositions that differ one from the other without common proportion to the statistical differences of homogeneous copolymers.

As used herein, the heterogeneous copolymers of the invention refers to a copolymer comprising a mixture of macromolecular chains having a $C_2F_3H$ content that changes within significant proportions; the polymer chains that are richest in $C_2F_3H$ monomeric units have a molar content comprised between about 35 and about 44%. The polymer chains poorest in $C_2F_3H$ monomeric units are between about 12.6 and about 3%, at a total molar content of $C_2F_3H$ in the copolymer of less than about 30%. By comparison, a homogeneous copolymer with a total molar content of $C_2F_3H$ comprises macromolecular chains statistically substantially identical and all containing about 30% $C_2F_3H$.

Not all $VF_2$-$C_2F_3H$ heterogeneous copolymers have the aforementioned desirable properties. Only the copolymers having a curve of distribution of accumulated molar composition comprised between two straight lines of the equation:

$$Y = -3.18X + 140 \text{ and}$$

$$Y = -3.12X + 109$$

X being the molar percentage of $C_2F_3H$ in the macromolecular chains; Y being the percentage by weight of the combination of macromolecular chains, the molar $C_2F_3H$ content of which is above or equal to X. The percentage by weight is expressed in relation to the total weight represented by all of the chains whatever their $C_2F_3H$ content.

According to the curves that define the $VF_2$-$C_2F_3H$ copolymers, these copolymers comprised the sum of macromolecular chains of $VF_2$-$C_2F_3H$, the molar $C_2F_3H$ content of which is in a range of from about 3% to about 44%. The total molar content of $C_2F_3H$ in the heterogeneous copolymer is preferably comprised between about 17% and about 27%.

The molar percentage of $C_2F_3H$ can be measured by proton nuclear magnetic resonance (NMR), the components of the links originating from the $VF_2$ and from the $C_2F_3H$ being sufficiently fixed at 200 MHz for allowing the measurement of their relative intensity.

DETAILED DESCRIPTION OF THE INVENTION

The Y and Y' percentages by weight can be determined by a fractionation method. One method comprises dissolving the entire copolymer in a solvent such as dimethyl formamide, at a concentration of 10 g/l. Control quantities of a non-solvent such as formamide are then added to precipitate fractions which are collected. This technique of fractionation rests on the principle that the copolymer chains richest in $VF_2$ precipitate first. In the case of the copolymers with a range of molecular compositions, there can simultaneously occur a fractionation by molecular weights, the higher molecular polymer weights precipitating before the lower molecular weight polymer. This phenomenon can cause irregularities in the progression of the $C_2F_3H$ contents of the polymer in the course of the fractionation process and introduce imprecision in the determination of the histogram of the composition. To overcome this difficulty, it is possible to eliminate the molecular weight parameter by effecting a preparatory fractionation by steric exclusion chromatography (GPC) to prepare six fractions according to their molecular weights.

The preparatory fractionation by GPC is made after having dissolved the copolymer in a solvent such as n-methyl pyrrolidone. Each one of the six fractions obtained by GPC is then fractionated as follows: after eliminating the first solvent, each one of the fractions is dissolved in a solvent such as dimethyl formamide so as to make a 10 g/l solution. To 100 cm³ of this solution, there is added a quantity of non-solvent such as formamide to cause a first cloudiness to appear.

The precipitate formed is filtered and oven-dried at 40° C. under vacuum, carefully weighed, then analyzed by proton NMR. Let $P_1$ and $X_1$ be the weight and the molar $C_2F_3H$ composition of this first fraction.

To the filtrate is then added a second quantity of non-solvent until a second precipitation appears. This precipitate is filtered and dried, weighed and analyzed by proton NMR. Let $P_2$ and $X_2$ be the weights and $C_2F_3H$ the molar composition of this fraction.

The above operation is then carried out n times until all the copolymer has been precipitated.

A weight $P_3$ and an $X_3$ composition for the 3rd fraction

A weight $P_4$ and an $X_4$ composition for the 4th fraction

A weight $P_n$ and an $X_n$ composition for the n th fraction.

The fractionation is effected on the six fractions originating from the preparatory GPC.

The whole of the fractions obtained are classified according to decreasing $C_2F_3H$. An index j, j going from 1 to m is attributed to each fraction classified in this order; let $X_j$ be the molar composition in $C_2F_3H$ of the $j^{th}$ fraction let $P_j$ be the weight of the jth fraction.

The accumulated histogram of composition is constructed by carrying Y as a function of $X_j$.

$$Y_j = \frac{\text{weight of the } J \text{ first fractions}}{\text{weight of all the } m \text{ fractions}} = \frac{P_1 + P_2 = P_3 \ldots + P_j}{P_1 + P_2 + P_3 \ldots + P_m}$$

For the heterogeneous copolymers according to the invention, the pairs $X_j$, $Y_j$ must be situated between two straight lines, the equations of which have been given above and illustrated below.

The heterogeneous copolymers can also be characterized by infrared spectrometry. By analogy with the vinylidene polyfluoride, the alpha phase denominates the crystalline form of orthorhombic structure and of the TGTG configuration. The crystalline form of orthorhombic or pseudohexagonal structure of a zig-zag configuration entirely planar under the form trans is called the beta phase. By infrared analysis, it is possible to measure the absorption at 765 cm$^{-1}$ characteristic of the alpha phase.

In comparing the proportion of alpha phase in different copolymers, it is first necessary to make sure that all the samples have undergone the same thermal cycle. The recommended method of characterization comprises making a film about 10 microns thick by pressing a sample at 220° C. under 20 tons pressure for 2 minutes. The film is positioned between two inox plates 50 microns thick. The mold is then withdrawn from the press and quickly brought into contact with the surface of a cold metal surface at a temperature of 20° C. A ratio R at 765 cm$^{-1}$ is defined as follows:

$$R = \frac{\text{optical density at 765 cm}^{-1} \times 100}{(\text{thickness of film}) \times (\% \text{ mole of VF}_2)}$$

The R ratio is proportional to the quantity of the alpha phase.

This method shows that in the $VF_2$ and $C_2F_3H$ homogeneous copolymers, a significant drop of the R ratio at 765 cm$^{-1}$ occurs above 15% molar of $C_2F_3H$. This is in conformity with the fact that above 15% molar of $C_2F_3H$ in the homogeneous copolymers, the alpha type crystalline organization is lost to have a beta type organization said to be at the origin of the piezoelectrical phenomenon.

In the homogeneous copolymers of $C_2F_3H$, at a molar composition comprised between 20 and 40%, the R ratio at 765 cm$^{-1}$ is almost zero, which is in agreement with the total absence of alpha phase that appears at about 15% molar of $C_2F_3H$. For a $VF_2$-$C_2F_3H$ copolymer of 90-10 molar composition, the R ratio at 765 cm$^1$ is near 50, which agrees with the presence of a significant portion of the alpha phase.

For a heterogeneous copolymer according to the invention, the ratio changes to substantially zero between about 5 and about 50 molar $C_2F_3H$. This is probably due to the presence of a substantial fraction of a copolymer of a composition less than 15% molar of $C_2F_3H$ organized in the alpha phase. This observation is confirmed by the straight lines that are illustrated in the figure which show that the proportion of copolymer of a composition less than or equal to 15% molar in $C_2F_3H$ and generally comprised between about 3 and about 15% molar in $C_2F_3H$ can represent up to about 38% by weight of the total copolymer. The controlled presence of alpha phase in the copolymer that is, of chains with a low content of $C_2F_3H$, provides the improvement of the maximum temperature of use of the $VF_2$- $C_2F_3H$ copolymer which nevertheless possesses excellent piezoelectric properties by virtue of the presence of the beta phase brought by the chains having a high content of $C_2F_3H$.

Another advantage of the heterogeneous copolymer of the present invention is shown in the improvement of the KT electromechanical coupling coefficient. The FT coefficient reflects the ability of a piezoelectric material for transforming mechanical energy into electrical energy or vice versa. KT is defined by the formula:

$$KT = \left( \frac{e_{233}}{C_{33}^D} \right)^{\frac{1}{2}} \xi_{33}$$

$e_{33}$ is the piezoelectric coefficient at an imposed stress $C_{33}$ is the elastic constant with constant induction $\epsilon_{33}$ is the dielectric constant at an imposed stress The KT value is obtained by analyzing the characteristic frequencies of the electric admittance by changing the frequency so as to pass the resonance and the antiresonance, the same as the first harmonic. The KT coefficient has been evaluated by means of a method that comprises designing the experimental curve according to a technique described by OHIGASHI (Journal Applied Physics 47 (3) 949-955 (1976)).

The analysis is performed on plates of about 1 cm² and 140 microns thickness at frequencies in the range of 1–50 Mhz.

There are techniques for increasing the KT coefficient which consist in thermal treatments during or prior to the polarization of the plate. European patent No. EP 0207347 and Australian patent No. B 66933/81 disclose such processes. The values of the KT coefficient shown in this application are obtained by similar thermal treatments of the copolymer.

The plates are soaked and annealed for 1 hour at 130° C. The measurements made on homogeneous copolymers reveal a maximum of the KT coefficient at a molar composition of 25% $C_2F_3H$. This is in agreement with Australian patent No. B 66933/81 The maximum is 0.25.

The $VF_2$-$C_2F_3H$ heterogeneous copolymers of the invention can be produced by copolymerization of $VF_2$ and $C_2F_3H$ according to known processes.

In a preferred method of preparation, a mixture of $VF_2$ 67 and 54% and about 33 and 46% of $C_2F_3H$ is introduced into a reactor. Additional $VF_2$ is progressively added during the course of the polymerization in proportions such that the molar quantity of $VF_2$ added during the course of the polymerization represents from about 145 to 180% of the number of moles of $VF_2$ at the beginning of the polymerization. The $VF_2$ must be progressively added at a rate which is a function of the rate of polymerization. The addition of $VF_2$ is preferably adjusted so that the quantity of $VF_2$ introduced per unit of time represents from 45 to 65% by weight of the copolymer formed during the same unit of time. According to this principle, a decrease in the rate of polymerization during the course of the polymerization must be followed by a decrease in the rate of addition of $VF_2$. The copolymerization is stopped soon after the total quantity of $VF_2$ has been added to the polymerization. The rates of transformation vary between about 65 and about 75%.

The polymerization reaction is carried out in an aqueous suspension, under known condition of stirring, temperature, and pressure, in the presence of known adjuvants such as protective colloids and organsoluble initiators. According to the known method of suspension polymerization, there is introduced into the reactor containing water, the colloid and the initiator, and then the initial mixture of monomers. While stirring, the temperature is maintained between about 30 and about 70° C., with the pressure between about 60 and about 110 bars.

In the supercritical state, the consumption of a monomer by polymerization is indicated by a drop of pressure in the polymerization zone. The drop of pressure is limited to a few bars by introducing $VF_2$ into the polymerization zone so that a drop in pressure of a few bars is not to be exceeded.

The examples that follow illustrate the invention without limiting it.

In these examples the maximum temperature of use is defined by subjecting a polarized piezoelectric plate to the following thermal treatments:
rise of temperature from 20° C. to T° C. at a speed of 10° C./min.
rest at T° C. for a half hour
drop in temperature from T° to 20° C. at the speed of 10° C./min.

During the thermal treatment, the sample is short circuited for cancelling the tensions induced by a pyroelectric effect. A measurement of the $d_{33}$ coefficient is made at 20° C. after each thermal cycle by means of a BERLINCOUR piezometer. Each $d_{33}$ coefficient thus measured is graphically shown as a function of each corresponding T temperature and the period of rest. By definition, the maximum temperature of use is the T temperature of the period of rest for which the $d_{33}$ coefficient had diminished by 10%.

EXAMPLE I

In an autoclave of about 3 liters capacity provided with a stirrer, there were introduced 2.17 liters water and 100 cubic centimeters of a 1% solution of methyl cellulose. After elimination of the oxygen under vacuum, there were added 328 grams of $C_2F_3H$ and 384 grams $VF_2$ and the internal temperature of the autoclave was raised to 50° C. The addition of the comonomers and the increase in temperature was accompanied by a rise in pressure up to about 90 bars; there were then added 2 grams diisopropyl perdicarbonate in 40 grams ethyl acetate to start the polymerization reaction.

The pressure was permitted to drop from 90 to 87 bars and the drop in pressure was compensated for by adding $VF_2$. After adding 550 grams $VF_2$ in 5.5 hours to compensate for the drops of pressure, the pressure was permitted to drop to 80 bars and the autoclave was rapidly cooled.

After removing residual gas from the monomer, the copolymer was washed and dried. About 1014 grams of copolymer were recovered.

The NMR analysis showed a total molar composition of 22% $C_2F_3H$.

A plate of 140 microns thickness was made by molding the copolymer mixture at 200° C. The plate was soaked and annealed for 1 hour at 130° C.

Platinum and gold electrodes were formed on the plate which was then subjected to a sinusoidal tension that was progressively changed from 30 V/micron to 100 V/micron at a frequency of 0.01 Hz in 1 hour according to French Patent No. 2,538,157.

The $d_{33}$ coefficient measured on the treated plate was 31 pc/N (picocoulomb per Newton)

The maximum temperature of use was 110° C. The KT coefficient was 0.3.

From the measurements of different fractionations of the copolymer, its accumulated histogram corresponded to the formula $$Y = -3.03X + 121$$

The R ratio at 765 cm$^{-1}$ was 17.

EXAMPLE 2

In an autoclave of about 3 liters capacity provided with a stirrer, there were introduced 2.17 liters of water and 100 cubic centimeters of a 1% solution of methyl cellulose. After eliminating the oxygen under vacuum, there were added 328 grams $C_2F_3H$ and 384 grams $VF_2$ and the internal temperature of the autoclave was raised to 50° C. The addition of the comonomers and increase in temperature was accompanied by a rise in pressure to about 90 bars; there were then added 2 grams diisopropyl perdicarbonate in 40 grams ethyl acetate to start the polymerization.

The pressure was permitted to drop from 90 to 87 bars and the drop in pressure was compensated for by adding VF$_2$. After adding 510 grams VF$_2$ in 5.5 hours to compensate for the drop in pressure, the pressure was permitted to drop to 80 bars and the autoclave was rapidly cooled.

After removing gas from the residual monomer, the copolymer was washed and dried. About 1014 grams of copolymer were recovered.

The NMR analysis showed a total molar composition of 24% C$_2$F$_3$H.

A plate 140 microns thick was made by molding the copolymer at 200° C. This plate was soaked and annealed for 1 hour at 130° C.

Platinum and gold electrodes were formed on the plate which was then subjected to a sinusoidal tension that was progressively changed from 30 V/micons to 100 V/microns at a frequency of 0.01 Hz in 1 hour according to French patent No. 2,538,157.

The d$_{33}$ coefficient measured on the treated plate was 30 pc/N.

The maximum temperature of use was 110° C.

The KT coefficient was 0.28.

From measurements of different fractionations of the copolymer its accumulated histogram corresponded to the formula $$Y = -3.75X + 146$$

The R ratio at 765 cm$^{-1}$ was 7.

EXAMPLE 3

In an autoclave of about 3 liters provided with a stirrer, there were introduced 2.17 liters of water and 100 cc of 1% a solution of methyl cellulose. After eliminating the oxygen under vacuum, there were added 328 grams C$_2$F$_3$H and 384 grams VF$_2$ and the internal temperature of the autoclave was raised to 50° C. The addition of comonomers and increase in temperatures was accompanied by a raise in pressure to about 90 bars; there were then added 2 grams diisopropyl perdicarbonate in 40 grams ethyl acetate to start the polymerization reaction.

The pressure was permitted to drop from 90 to 87 bars and the drop of pressure was compensated for by addition of VF$_2$. After adding 585 gram VF$_2$ in 5.5 hours to compensate for the drops of pressure, the pressure was allowed to drop to 80 bars and the autoclave was rapidly cooled.

After removing the gas from the residual monomer, the copolymer was washed and dried. About 1115 g of copolymer were recovered.

Analysis by NMR showed a total molar composition of 19.5% C$_2$F$_3$H.

A plate 140 microns thick was made from the copolymer by molding at 200° C. The plate was soaked and annealed for 1 hour at 130° C.

Platinum and gold electrodes were formed on the plate which was then subjected to a sinusoidal tension which progressively changed from 30 V/micron to 100 V/micron at a frequency of 0.01 Hz in 1 hour according to French patent 2,538,157.

The d$_{33}$ coefficient measured on the treated plate was 29 pc/N.

The KT coefficient was 0.27

The maximum temperature of use was 105° C.

The measurements of different fractionations of the copolymer showed that its accumulated histogram corresponded to the formula:

$$Y = 2.84X + 111.4$$

The R ratio at 765 cm$^{-1}$ was 26.

EXAMPLE 4

Comparative Example With A Homogeneous Copolymer

In an autoclave of about 3 liters provided with a stirrer, there were introduced 2.17 liters water and 100 cc of a 1% solution of methyl cellulose. After eliminating the oxygen under vacuum, there were added 213 grams C$_2$F$_3$H and 499 gram VF$_2$ and the temperature was raised to 50° C.

The addition of monomers and increase in temperature was accompanied by a rise in pressure to about 90 bars. There were then added 2 grams diisopropyl perdicarbonate in 40 grams of ethyl acetate to start the polymerization.

The pressure was allowed to drop from 90 to 87 bars and the drop of pressure was compensated for by addition of water. After having added 500 grams of water in 5 hours to maintain the pressure between 90 and 87 bars, the pressure was allowed to drop to 80 bars and the autoclave was rapidly cooled.

After removing the gas from the residual monomer, the copolymer was washed and dried. About 680 grams of copolymer were recovered.

The NMR analysis showed a total molar composition of 22% C$_2$F$_3$H.

A plate 140 microns thick, was made as described in Example 1 and the plate was polarized in the same manner.

The piezoelectric measurements of the plate were as follows:
piezoelectric coefficient d$_{33}$:26 pc/N
maximum temperature of use:102° C.
KT coefficient:0.22

The fraction of the copolymer gave a cumulative histogram corresponding to the formula:

$$X = 23$$

The behavior of the fraction was very different for the homogeneous copolymers. Almost all the polymer precipitated in the first fraction and the extreme differences between fractions were always less than 5 molar % of VF$_3$.

The ratio at 765 cm$^{-1}$ was zero.

EXAMPLE 5

Comparative Example With A Heterogeneous Copolymer

In an autoclave of about 3 liters provided with a stirrer, there were introduced 2.27 liters of water and 100 cubic centimeters of a 1% solution of methyl cellulose. After elimination of the oxygen under vacuum, there were added 298 grams C$_2$F$_3$H and 314 grams VF$_2$, and the temperature was raised to 50° C. The addition of monomers and increase in temperature was accompanied by a rise in pressure to about 90 bars; then there were added 2 grams diisopropyl perdicarbonate in 40 grams ethyl acetate to start the polymerization. The polymerization temperature was maintained at 50° C. The pressure was allowed to drop from 90 to 87 bars and the drop in pressure was compensated for by addition of VF$_2$ After adding 440 grams VF$_2$ in 4.5 hours, the pressure was allowed to drop to 80 bars and the autoclave was rapidly cooled. After removing gas from the residual monomer, the copolymer was washed and dried. About 880 grams of copolymer were recovered.

The NMR analysis gave a total molar composition of 29% $C_2F_3H$.

A plate 140 microns thick was made and the plate was polarized in a manner identical with that of Example 1.

The piezoelectric measurements effected on the plate were as follows:
piezoelectric coefficient $d_{33}$:27 pc/N
maximum temperature of use:76° C.
coefficient of electromechanical coupling 0.17

The fractioning of this copolymer gave an accumulated histogram corresponding to the formula:

$$Y=3.12X+150$$

The R ratio at 765 cm$^{-1}$ was equal to 0.

EXAMPLE 6

Comparative Example With A Heterogeneous Copolymer

In an autoclave of about 3 liters provided with a stirrer, there were introduced 2.02 liters water and 100 cubic centimeters of a 1% solution of methyl cellulose. After elimination of the oxygen under vacuum, there were added 499 grams $VF_2$ and 213 grams $C_2F_3H$ and the temperature was raised to 50° C.

The addition of the monomers and increase in temperature was accompanied by a rise in pressure to about 90 bars; then there were added 2 grams diisopropyl perdicarbonate in 40 grams ethyl acetate to start the polymerization. The polymerization temperature was maintained at 50° C.; the pressure was allowed to drop from 90 to 87 bars and the drop of pressure was compensated for by adding $VF_2$. After adding 520 grams $VF_2$ in 6 hours the pressure was allowed to drop to 80 bars and the autoclave was rapidly cooled. After removing the gas from the residual monomer, the copolymer was washed and dried. About 985 grams of copolymer were recovered.

The NMR analysis gave a total molar composition of 17% $C_2F_3H$.

A plate 140 microns thick was made and it was polarized in a manner identical with Example 1.

The piezoelectric measurements effected on the plate were as follows:
piezoelectric coefficient $d_{33}$:20 pc/N
maximum temperature of use 110° C.
KT coefficient:15

The fraction of this copolymer gave an accumulated histogram corresponding to the formula:

$$Y=4.34X+117$$

The P ratio at 765 cm$^{-1}$ was 67.

What is claimed is:

1. A process for preparation of a copolymer of vinylidene fluoride and trifluoroethylene having a heterogeneous structure and having piezoelectric properties and an elevated maximum temperature of use, and a total molar content of trifluoroethylene of less than about 30%, which comprises copolymerizing in an aqueous suspension, vinylidene fluoride and trifluoroethylene in the presence of a protection colloid and a polymerization initiator at a temperature between about 30° and about 70° C. under a pressure between about 50 and about 110 bars, in a polymerization zone wherein a mixture of vinylidene fluoride and a trifluoroethylene in molar proportions of vinylidene fluoride is between about 67 and about 54% and the trifluoroethylene is from about 33 to about 46% is present at the beginning of the polymerization, the vinylidene fluoride is progressively added to the polymerization zone in the course of reaction, in proportions such that the molar quantity of vinylidene fluoride added is from about 145 to about 180% of the number of moles or vinylidene fluoride present at the beginning of the polymerization.

2. A process of claim 1 wherein the vinylidene fluoride added to the polymerization zone per unit of time is from about 45 to 65% by weight of the copolymer formed during the same unit of time.

3. A process of claim 1 wherein the vinylidene fluoride is added at a rate to maintain the pressure in the polymerization zone between a selected pressure P and P-3 bars.

4. The copolymer prepared by the process of claim 1.

5. The copolymer prepared by the process of claim 2.

6. The copolymer prepared by the process of claim 3.

* * * * *